US008575669B2

(12) United States Patent
Jang

(10) Patent No.: US 8,575,669 B2
(45) Date of Patent: Nov. 5, 2013

(54) FABRICATING TECHNIQUE OF A HIGHLY INTEGRATED SEMICONDUCTOR DEVICE IN WHICH A CAPACITOR IS FORMED BETWEEN ADJACENT GATE PATTERNS BY USING A NANOTUBE PROCESS

(75) Inventor: Chi Hwan Jang, Icheon (KR)

(73) Assignee: Hynix Semiconductor Inc, Icheon (KR)

( * ) Notice: Subject to any disclaimer, the term of this patent is extended or adjusted under 35 U.S.C. 154(b) by 247 days.

(21) Appl. No.: 12/650,335

(22) Filed: Dec. 30, 2009

(65) Prior Publication Data

US 2011/0001175 A1 Jan. 6, 2011

(30) Foreign Application Priority Data

Jul. 3, 2009 (KR) .................. 10-2009-0060572

(51) Int. Cl.
*H01L 27/08* (2006.01)
*H01L 29/94* (2006.01)
*H01L 21/8242* (2006.01)

(52) U.S. Cl.
USPC ............ 257/301; 257/296; 257/E21.646; 438/243

(58) Field of Classification Search
USPC ........... 257/296, E21.645, E27.016, E27.081, 257/301, 68, 71, 298, 307, 516; 438/243, 438/171, 190, 210, 238–239, 386
See application file for complete search history.

(56) References Cited

U.S. PATENT DOCUMENTS

| 5,442,584 A * | 8/1995 | Jeong et al. ............... 365/149 |
| 5,595,928 A * | 1/1997 | Lu et al. .................... 438/253 |
| 5,729,034 A * | 3/1998 | Park ......................... 257/296 |
| 2004/0169217 A1* | 9/2004 | Houston .................. 257/296 |
| 2004/0262637 A1* | 12/2004 | Reisinger et al. ......... 257/200 |
| 2006/0221548 A1* | 10/2006 | Lee et al. ................. 361/306.3 |
| 2008/0003768 A1* | 1/2008 | Oh .......................... 438/399 |

FOREIGN PATENT DOCUMENTS

| JP | 2004-146520 A |   | 5/2004 |
| JP | 2004146520 A | * | 5/2004 |
| KR | 1020040059486 A |   | 7/2004 |
| KR | 2004069492 A | * | 8/2004 |
| KR | 1020040069492 A |   | 8/2004 |

OTHER PUBLICATIONS

An english machine translation of KR 2004069492 A.*
JP 2004146520 A.*

* cited by examiner

*Primary Examiner* — Daniel Luke
*Assistant Examiner* — Khaja Ahmad

(57) ABSTRACT

The present invention relates to a highly integrated semiconductor device in which a capacitor is formed between adjacent gate patterns by using a nanotube process. A semiconductor memory device according to an example embodiment of the present invention includes a capacitor formed on a first side of a source/drain region positioned between gate patterns of adjacent cell transistors; a plate layer connected to an upper portion of the capacitor, the plate layer being formed in a direction intersecting the gate pattern; and a bit line connected to a second side of the source/drain region of the cell transistor, the bit line being formed in the direction intersecting the gate pattern.

9 Claims, 12 Drawing Sheets

FABRICATING TECHNIQUE OF A HIGHLY INTEGRATED SEMICONDUCTOR DEVICE IN WHICH A CAPACITOR IS FORMED BETWEEN ADJACENT GATE PATTERNS BY USING A NANOTUBE PROCESS

CROSS-REFERENCES TO RELATED APPLICATIONS

The present application claims priority to Korean patent application number 10-2009-0060572, filed on Jul. 3, 2009, which is incorporated by reference in its entirety.

BACKGROUND OF THE INVENTION

The present invention relates to a semiconductor device, more particularly, to a semiconductor device and a method thereof, in which a capacitor included in a unit cell of the semiconductor device is formed between gate patterns so that manufacturing time and cost as well as a defect ratio of manufactured products are reduced.

A semiconductor device functioning as an electronic apparatus designed to perform a specific operation can be fabricated using a process including steps of injecting an impure material and depositing conductive and nonconductive materials onto a predetermined area of a wafer mounted in chamber. For example, a semiconductor memory device is an example of a semiconductor device that can be made by such a process. A semiconductor memory device can include various components or elements such as a transistor, a capacitor, a resistor, a fuse, and others. In an exemplary semiconductor memory, a capacitor is often mainly used for temporarily storing data, and a fuse can be used in a redundancy circuit and/or in a power supply circuit of the semiconductor memory. Various elements in a semiconductor memory device are generally connected to one another through a conductive layer to transmit data, control signals and/or other information among the elements.

Manufacturing technology for semiconductor devices has advanced to allow an increased integration density in devices, and a corresponding decrease in the size of chips. Hence a wafer can include more chips than that in the past. When increasing the density, the minimum line width specified by a design rule is generally decreased. Another consequence of greater integration density is that the semiconductor devices can operate at greater speeds while consuming less power.

A semiconductor memory device generally includes a plurality of unit cells, each unit cell comprising a transistor and a capacitor. When an electrical signal representing a binary data value of "1" is delivered to a capacitor, an amount of electric charge is temporarily stored in a storage node SN connected to one electrode of the capacitor. However, the amount of electric charge retained in the capacitor decreases over time owing to leakage current at a junction of the storage node, and/or other capacitor leakage characteristics. In an effort to ameliorate leakage, the capacitance Cs of the capacitor in the unit cell may be increased so that the semiconductor memory device can store a greater amount of electric charge in the storage node SN during a write operation. One of the most common approaches to increasing the capacitance Cs of the capacitor is to replace at least a portion of the oxide dielectric layer found in the storage node of conventional unit cells with an insulator having a higher dielectric constant than oxide, such as a nitrided oxide layer. Furthermore, if the substitute dielectric has superior insulating properties, the junction leakage current may be reduced. Yet another method to increase the capacitance Cs of the capacitor is to form the capacitor in a three-dimensional structure such as a cylindrical structure or a trench structure, thereby providing increased capacitor electrode area relative to a conventional two-dimensional planar structure.

When design rule dimensions are reduced, the allowable planar cross sectional area in which a capacitor can be formed is also reduced. To at least partly compensate for the decrease in distance between adjacent gate patterns with smaller design rules, it is common for a capacitor connected to source/drain between adjacent gate patterns to be formed in a configuration that situates at least a portion of the capacitor in an upper level of the device above the gate pattern or the bit line, rather than being confined entirely within the two dimensional space bounded by the gate patterns.

FIG. 1 is a cross-sectional view showing aspects of a conventional semiconductor device.

As illustrated in FIG. 1, the semiconductor device includes an active region 104 defined by a field isolation layer 102 which is formed over a semiconductor substrate using conventional shallow trench isolation (STI) techniques. Gate patterns 106a and 106b are formed on the field isolation layer 102 and the active region 104. Also, although not shown in the drawing, a source/drain region is formed on both sides of the gate pattern 106a.

Landing plug contacts 108a and 108b are formed on the source/drain region that is positioned between adjacent gate patterns. The landing plug contact 108a formed between adjacent gate patterns 106a that are formed on the active region 104 is connected to a bit line contact 112 and a bit line 110. The landing plug contact 108b formed between the gate pattern 106a, which is formed on the active region 104, and the gate pattern 106b, which is formed on the field isolation layer 102, is connected to a capacitor 120.

The gate patterns 106a and 106b as part of a word line intersect the bit line 110 and, as shown in FIG. 1. The bit line 110 is positioned to be higher than the gate patterns 106 and 106b.

The capacitor 120 must be electrically insulated from the bit line 110 and, as mentioned above, preferably has a large capacitance. Thus, the capacitor 120 is in a position above the bit line 110 and has a high aspect ratio pillar shape that extends in a vertical direction. A storage node contact 114 to the capacitor is additionally formed in the semiconductor memory device for connecting the capacitor 120 to the landing plug contact 108b that is formed between the gate patterns 106a and 106b.

A plate line 122 for transferring a plate voltage to one electrode of the capacitor 120 is formed on the capacitor 120. Metal interconnections and fuses M1 through M3 are formed on the plate line 122. Although not described herein, various insulation layers can be formed between various components of the semiconductor device where electrical connection is unwanted.

The structure of the semiconductor memory device illustrated in FIG. 1 is designed to maintain the capacitance of the capacitor as design rules are decreased, and allows forming the capacitor in a high aspect ratio pillar pattern in a position above the bit line 110. In this manner, the capacitor can have increased surface area by forming a capacitor having the greatest practical height in a given horizontal cross sectional planar surface area. Such a pillar shaped capacitor pattern can nearly double capacitance relative to a two dimensional planar structure. However because this type of pillar pattern capacitor tends to incline from vertical owing to the high aspect ratio and because patterns formed in the central area and peripheral areas of a wafer often have different thicknesses or sizes, it is difficult to manufacture a cell array of such capacitors having sufficiently uniform characteristics.

In addition, metal interconnections and the fuses formed over the capacitor are elements that are to be formed at a later processing step. It is difficult to control the thickness and/or the size of the metal interconnection and the fuse because the metal interconnection and the fuse are formed by a process of depositing and patterning metal on the isolation layer while simultaneously ensuring that no damage occurs to other components such as the capacitor that are in a position below the metal interconnection and fuse levels.

BRIEF SUMMARY OF THE INVENTION

To overcome the above mentioned problem of the related art, the present invention provides a capacitor formed between adjacent gate patterns of a highly integrated semiconductor device by using a nanotube process so that the semiconductor device has a reduced height while a capacitance of the capacitor is maintained. Furthermore, according to the prevent invention, the number of processes required to manufacture the semiconductor device is reduced so that time and cost of manufacturing as well as a defect ratio are reduced.

According to an embodiment of the present invention, a semiconductor memory device includes a capacitor formed on a first side of a source/drain region positioned between gate patterns of adjacent cell transistors; a plate layer connected to an upper portion of the capacitor, the plate layer being formed in a direction intersecting the gate pattern; and a bit line connected to a second side of the source/drain region of the cell transistor, the bit line being formed in the direction intersecting the gate pattern.

The capacitor has a lower electrode comprising a seed layer, which is formed on the first side of the source/drain region and a side wall of the gate pattern, and a plurality of one of conductive pillars and conductive wires, each of which has a fine size and is formed on the seed layer. The conductive pillar or the conductive wire has a length of about 1~1000 nm. The seed layer comprises a transition metal selected from among nickel, iron, cobalt, platinum, palladium, and/or a combination thereof.

The capacitor has a lower electrode comprising a seed layer, which is formed on the first side of the source/drain region, and a plurality of one of conductive pillars and conductive wires, each of which has a fine size and is formed on the seed layer, and wherein the conductive pillar or the conductive wire has a length substantially similar to a length of the gate pattern.

In another embodiment, the bit line is in a position higher than the plate layer, and the plate layer is directly connected to an upper electrode of the capacitor, the plate layer being formed in a plane structure.

In another embodiment, the plate layer is in a position higher than the bit line, and the plate layer is connected to an upper electrode of the capacitor through a plate contact, the plate layer having a line structure.

In another embodiment, the plate line is in a position higher than the bit line, and the capacitor has a height from the first side of the source/drain region to the plate line.

The capacitor comprises a lower electrode including a conductive layer and a plurality of one of conductive pillars and conductive wires; a dielectric layer formed on the conductive layer and the plurality of one of the conductive pillars and the conductive wires; and an upper electrode deposited on the dielectric layer.

Further, the semiconductor memory device comprises a landing plug contact and a bit line contact that are positioned between the second side of the source/drain region and the bit line.

According to another embodiment of the present invention, a method of manufacturing a semiconductor memory device includes forming a capacitor on a first side of a source/drain region positioned between gate patterns of adjacent cell transistors; forming a plate layer in a direction intersecting the gate pattern, the plate layer being connected to an upper portion of the capacitor; and forming a bit line in the direction intersecting the gate pattern, the bit line being connected to a second side of the source/drain region of the cell transistor.

The forming a capacitor comprises exposing the first side of the source/drain region by etching an insulation layer that is deposited between the gate patterns; forming a seed layer on the source/drain region and a side wall of the gate pattern; forming a plurality of one of conductive pillars and conductive wires using a nano growth, the conductive pillars and the conductive wires respectively having a minute size; depositing a dielectric material on the seed layer and the plurality of the conductive pillars and the conductive wires; and forming an upper electrode by filling a conductive material into the dielectric material.

The forming a plurality of one of conductive pillars and conductive wires comprises depositing a photosensitive material or a carbonaceous material on the seed layer by using at least one of a physical vapor deposition (PVD), a chemical vapor deposition (CVD), an atomic layer deposition (ALD), a spin and a spray method; removing the seed layer that is deposited on the gate pattern by using a chemical mechanical polishing process; removing the photosensitive material or the carbonaceous material; and performing a nano growth process on the seed layer.

In another embodiment, The nano growth process is performed within a temperature range of about 200-1000° C. and at a pressure of about 10 Torr or lower by using at least one of the chemical vapor deposition (CVD), an electric furnace, rapid thermal annealing (RTA), arc discharge, and laser deposition in a gas environment including a carbon, a saturated hydrocarbon or an unsaturated hydrocarbon such as $CH_4$, $C_2H_6$ or $C_4F_8$, or an aromatic hydrocarbon.

In another embodiment, the nano growth process is performed within a temperature range of about 200-1000° C. and at a pressure of about 10 Torr or lower by using at least one of the chemical vapor deposition (CVD), an electric furnace, rapid thermal annealing (RTA), arc discharge, and laser deposition in a gas environment including a silicon such as $SiH_4$, $Si_2H_6$ or $Si_4F_8$.

The forming the upper electrode includes performing a first depositing step to deposit the conductive material on the dielectric material by using one of an atomic layer deposition (ALD), a chemical vapor deposition (CVD), or a metal organic chemical vapor deposition (MOCVD) process; and performing, after the first depositing step, a second depositing step to fill the conductive material into a gap between the gate patterns.

Herein, the carbonaceous material is one of diamond like carbon (DLC) and amorphous carbon. The conductive material includes metal, silicate, silicide, polysilicon, Poly-SiGe, amorphous silicon or amorphous-SiGe or any combination thereof.

When the bit line is formed prior to a formation of the plate line, a plate contact on an upper electrode of the capacitor is formed before the formation of the plate line. Also, if the plate line is formed prior to a formation of the bit line, the plate line directly connects to an upper electrode of the capacitor.

When the bit line is formed prior to a formation of the capacitor, a lower electrode of the capacitor is positioned to be higher than the bit line that is above the first side of the source/drain region. When the bit line is formed after the formation of the capacitor, the lower electrode of the capacitor is positioned to be lower than the bit line.

DESCRIPTION OF EMBODIMENTS

In a semiconductor memory device according to exemplary embodiments disclosed herein, a capacitor included in a unit cell is formed on one side of a source/drain region positioned between gate patterns of a cell transistor while maintaining a capacitance of a capacitor. In the disclosed embodiments, a height of a semiconductor memory device may be greatly reduced, manufacturing is simplified, and the proportion of defective products ("defective ratio") is reduced. Hereinafter, exemplary embodiments of the present invention are described in detail with reference to the accompanying drawings.

Figure 1:
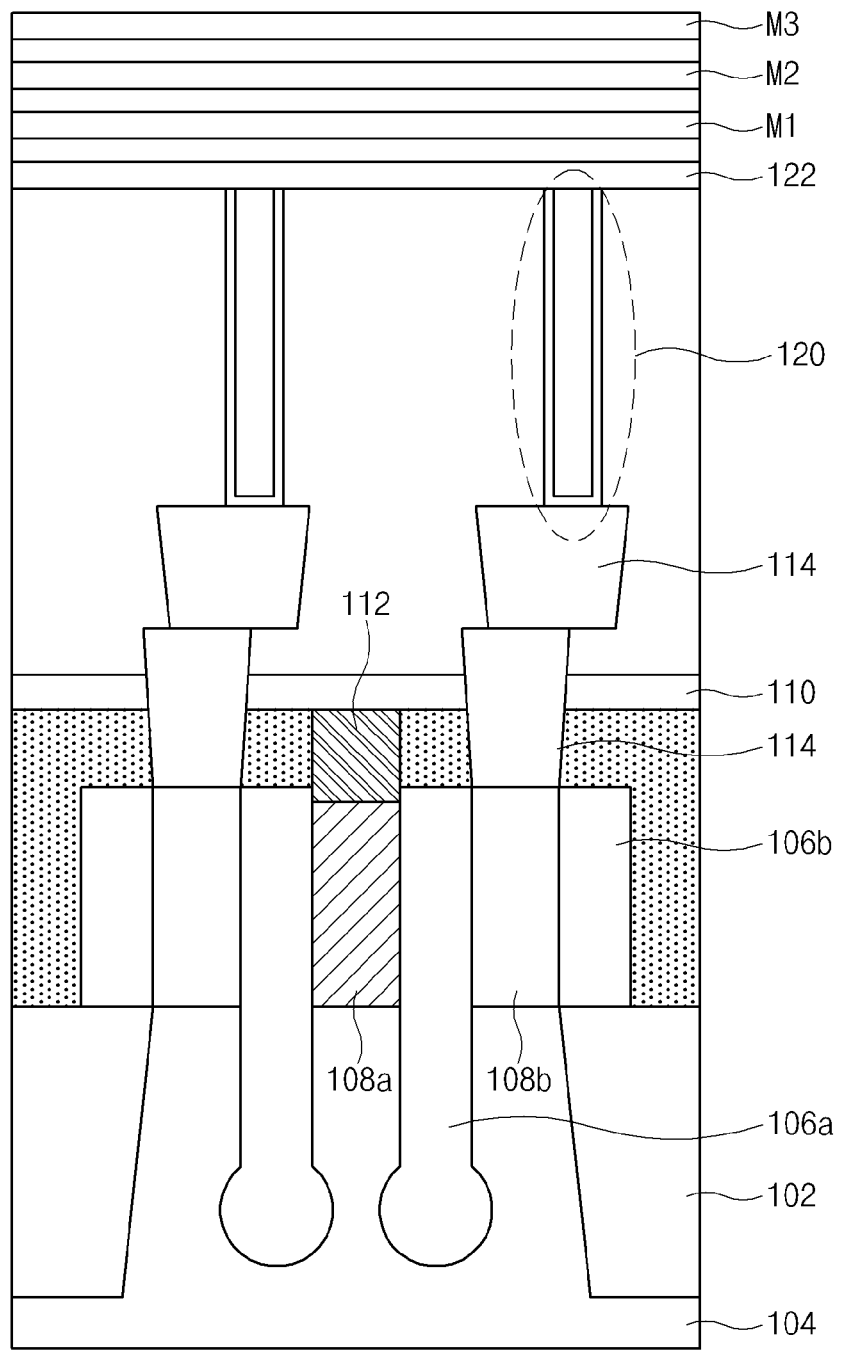
FIG. 1 is a cross-sectional view illustrating a semiconductor device according to the related art.
Figure 2:
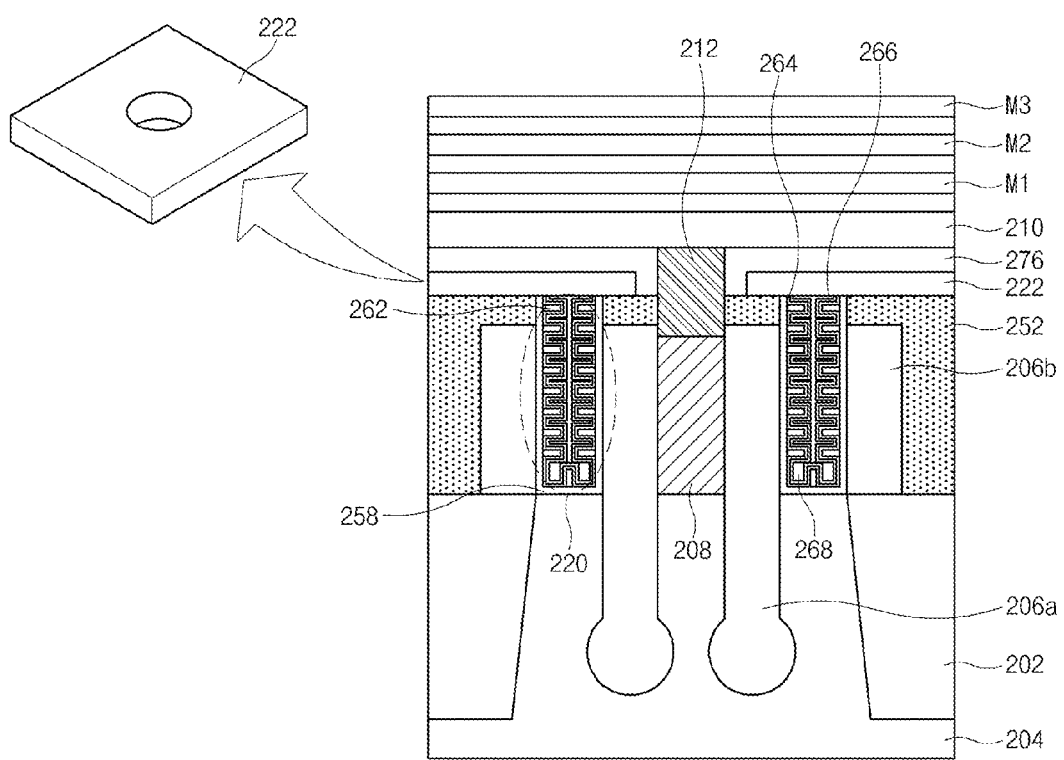
FIG. 2 is a cross-sectional view of a semiconductor memory device according to an embodiment of the present invention.

FIG. 2 is a cross-sectional view of a semiconductor memory device according to an embodiment of the present invention.

As shown in FIG. 2, the semiconductor memory device includes an active region 204 that is defined by a field isolation layer 202 formed on a semiconductor substrate by a shallow trench isolation (STI) technique. Gate patterns 206a and 206b are formed on the field isolation layer 202 and the active region 204. Although not shown in FIG. 2, a source/drain region is formed on both sides of the gate pattern 206a using ion implantation.

A landing plug contact 208 is formed on the source/drain region that is positioned between adjacent gate patterns. The landing plug contact 208 that is formed between adjacent gate patterns formed on the active region 104 is connected to a bit line contact 212 and thereby to bit line 210. A capacitor is positioned between the gate pattern 206a formed on the active region 204 and the gate pattern 206b formed on the field isolation layer 202.

A plate layer 222 for transferring a plate voltage to one electrode of the capacitor 220 is formed on an upper portion of the capacitor 220. The bit line 210 is formed above the plate layer 222 and on an isolation layer 276. The bit line 210 extends in a direction intersecting the gate patterns 206a and 206b, wherein the gate patterns 206a and 206b are part of a word line. Also, a metal interconnection and fuses M1 through M3 are disposed on and above the bit line 210. Although not mentioned in the above, isolation layers can be formed where electrical connections among components of the semiconductor memory device are unwanted. In an embodiment of a semiconductor memory device disclosed herein, a plate line for applying a plate voltage to the capacitor 220 is formed in a plate layer 222 having a planar structure. After the plate layer 222 is formed, the bit line contact 212 is formed to pass through the plate layer 222.

In the instant semiconductor memory device embodiment, a compact capacitor 220 having enhanced capacitance can be formed between the gate patterns 206a and 206b, thereby obviating a need to form a capacitor having a high aspect ratio in a position above the bit line. Therefore, the semiconductor memory device of the present embodiment can have a height that is greatly reduced compared to the conventional semiconductor memory device. The capacitor 220 of the semiconductor memory device of the present embodiment is placed between the gate patterns 206a and 206b and is formed in a configuration providing an unexpectedly high capacitance. A capacitor having relatively high capacitance can be formed within a relatively small planar cross sectional area using a nano growth method as disclosed below.

FIGS. 3a through 3l are cross-sectional views illustrating a method of manufacturing the semiconductor memory device of FIG. 2.

Figure 3A:
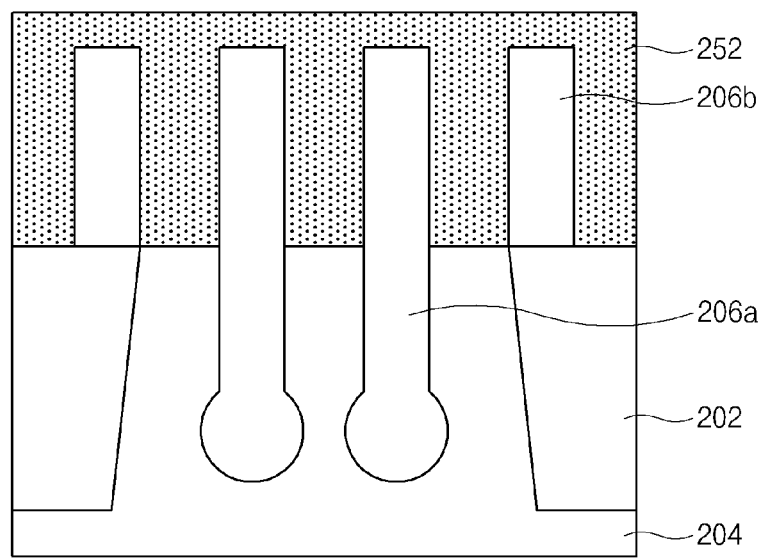
FIGS. 3a through 3l are cross-sectional views illustrating a method of manufacturing a semiconductor memory device embodiment relative to FIG. 2.

As illustrated in FIG. 3a, after the active region 204 is defined by the field isolation layer 202 and the gate patterns 206a and 206b including a gate electrode, a spacer, and a hard mask are formed, an interlayer insulation layer 252 is formed between the gate patterns 206a and 206b. Also, in upper part of the active region 204 at sides of the gate patterns 206a and 206b, doped regions used as source/drain of the transistor are formed by ion-implantation. Here, the interlayer insulation layer 252 can be formed using one or more layers comprising an oxide, a nitride, a phosphosilicate glass (PSG), and/or a borophosphate silicate glass (BPSG). Such layers can be formed using various precursors such as tetraethylorthosilicate (TEOS), and can be deposited by using a chemical vapor deposition (CVD), a plasma enhanced chemical vapor deposition such as deposition using a high density plasma (HDP), a physical vapor deposition (PVD), a atomic layer deposition (ALD), a furnace and/or a spin-on method for forming a layer.

Figure 3B:
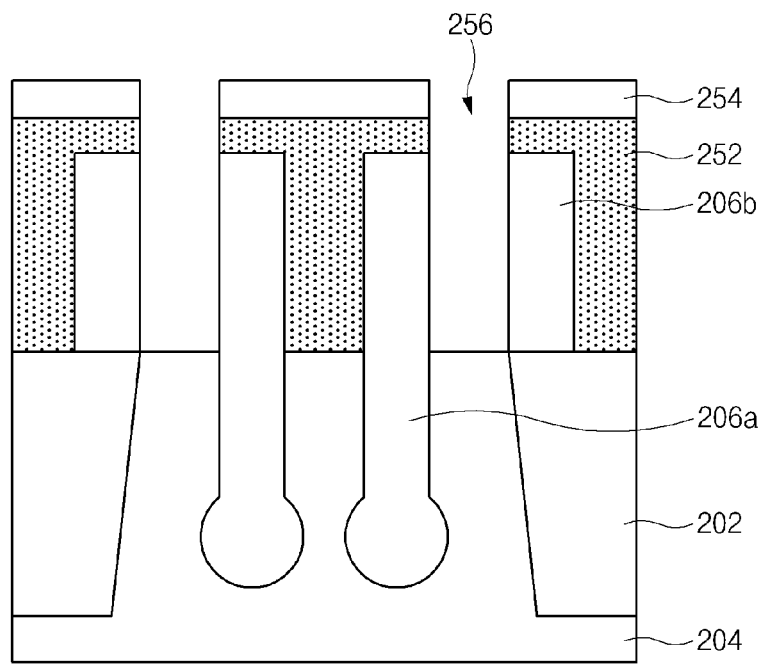

Referring to FIG. 3b, a photoresist 254 deposited on the interlayer insulation layer 252 is patterned such that the interlayer insulation layer 252 corresponding to an area in which the capacitor 220 is to be formed is etched to expose a portion of the source/drain region of the active region 204. Specifically, the photoresist 254 is patterned to expose a portion of the interlayer insulation layer 252 by a photolithography that uses a mask defining a location of the landing plug contact that is formed on an existing storage node region. Next, the exposed interlayer insulation layer 252 is removed by using a dry or wet etching process to form a first contact hole 256, and then the remaining photoresist 254 is removed.

Figure 3C:
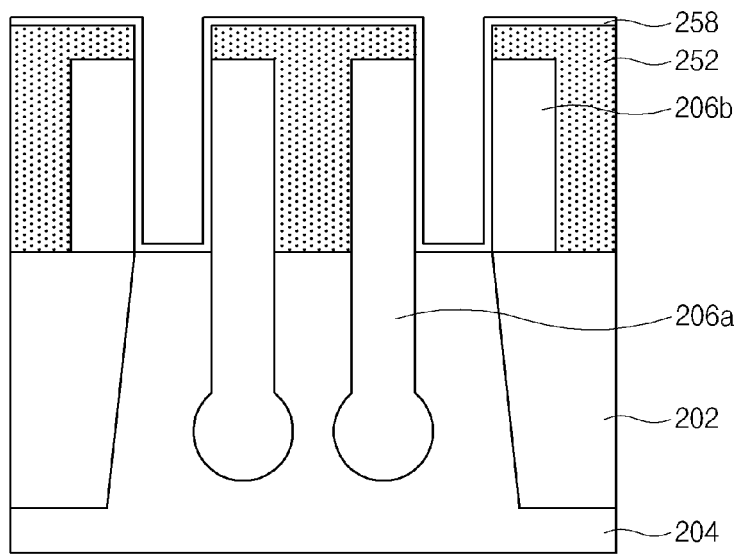

As illustrated in FIG. 3c, a seed layer 258 is formed on the source/drain region exposed by the first contact hole 256 and a side wall of the gate pattern. Here, the seed layer 258 can comprise material selected from among the group consisting of a metal, nickel, iron, cobalt, platinum, palladium and/or alloys of materials in the group.

Figure 3D:
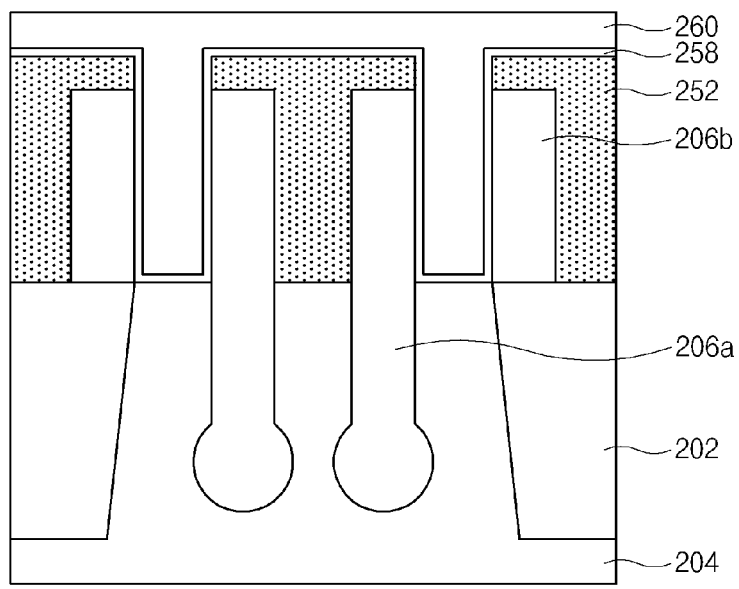

Referring to FIG. 3d, a photosensitive material or a carbonaceous material is deposited on the seed layer 258 using a PVD, CVD, ALD, spin-on and/or spray method to form a mixture layer 260. In one aspect, the carbonaceous material can be a form of diamond like carbon (DLC) or it can be a form of amorphous carbon.

Figure 3E:
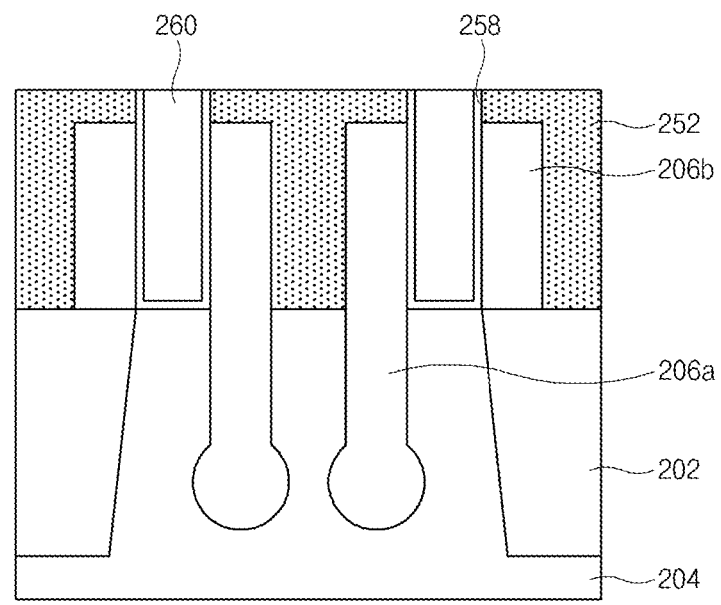

As illustrated in FIG. 3e, the mixture layer 260 is etched using a chemical mechanical polishing (CMP) process until the interlayer insulation layer 252 is exposed. By using a chemical mechanical polishing process to remove material, not only the photosensitive material or the carbonaceous material, but also the seed layer 258 can is be removed from the interlayer insulation layer 252.

Figure 3F:
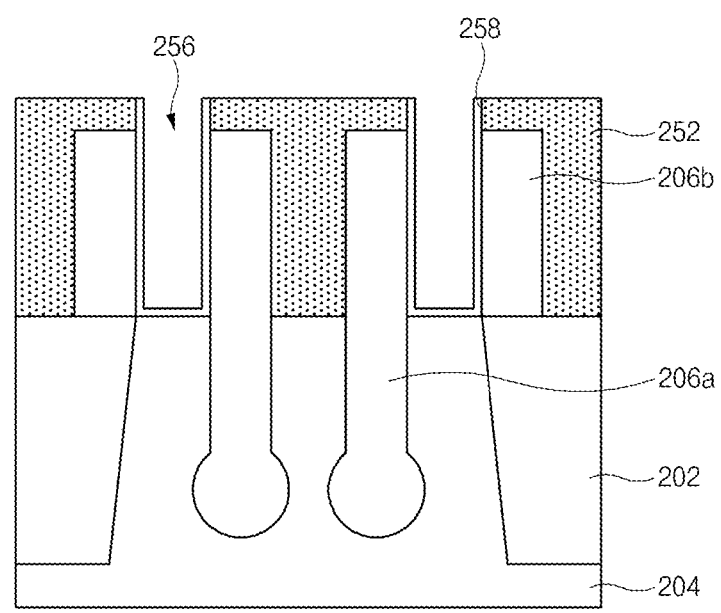

Referring to FIG. 3f, the mixture layer 260 deposited in the first contact hole 256, which is formed between the gate patterns 206a and 206b, is removed to expose the seed layer 258. The processes illustrated in FIGS. 3d through 3f that occur between a process of depositing the mixture layer 260 and a process of removing the mixture layer 260 after the chemical mechanical polishing (CMP) process are performed for purpose of removing the seed layer 258 deposited on the interlayer insulation layer 252. Particularly, the reason why the mixture layer 260 is formed from photosensitive material or carbonaceous material is because it facilitates removing the mixture layer 260 in the first contact hole 256 by an etching process using an aqueous etchant such as an etchant comprising HF, or an etchant comprising NH3, without damaging the seed layer 258.

Figure 3G:
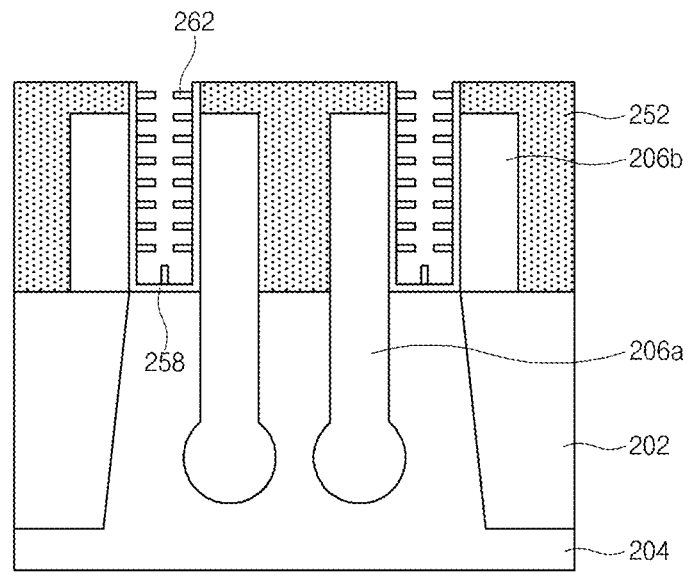

As illustrated in FIG. 3g, a plurality of conductive pillars 262, each having a minute size, are formed using a nanotube growth process. Here, the nanotube growth can be carried out within a temperature range of 200-1000° C. and at a pressure of 10 Torr or lower by using a CVD process, an electric furnace heating process, rapid thermal annealing (RTA), an arc discharge, or laser deposition in a gaseous environment. The process is performed in an atmosphere comprising carbon, a saturated hydrocarbon, an unsaturated hydrocarbon such as $CH_4$, $C_2H_6$ or $C_4F_8$, and/or an aromatic hydrocarbon. In various embodiments where a silicon compound is used in a growth process, the nanotube growth can be performed out within a temperature range of 200-1000° C. and at a pressure of 10 Torr or below using at least one of a CVD process, an electric furnace, RTA, an arc discharge, and laser deposition in a gas environment. The growth can be effectuated in a process gas including a silicon containing compound such as $SiH_4$, $Si_2H_6$ or $Si_4F_8$. On one embodiment, a plurality of the conductive pillars 262 formed using a nanotube growth process have dimension the range of about 1 to 1000 nm and can be formed on the overall seed layer 258.

Figure 3H:
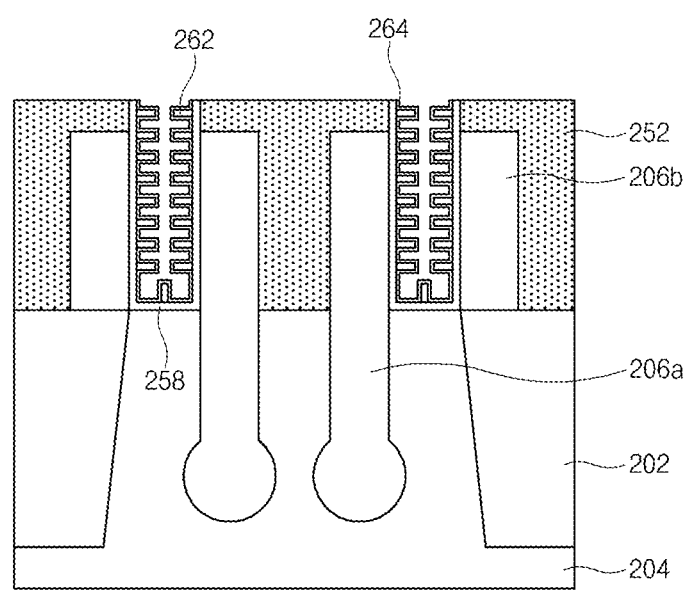

Referring to FIG. 3h, a dielectric material is deposited on the seed layer 258 and the plurality of the conductive pillars 262 to form a dielectric layer 264. Here, the dielectric material can comprise an oxide layer, a nitride layer, an oxide-nitride-oxide (ONO) and/or an insulating material having a high dielectric constant (high-k).

Figure 3I:
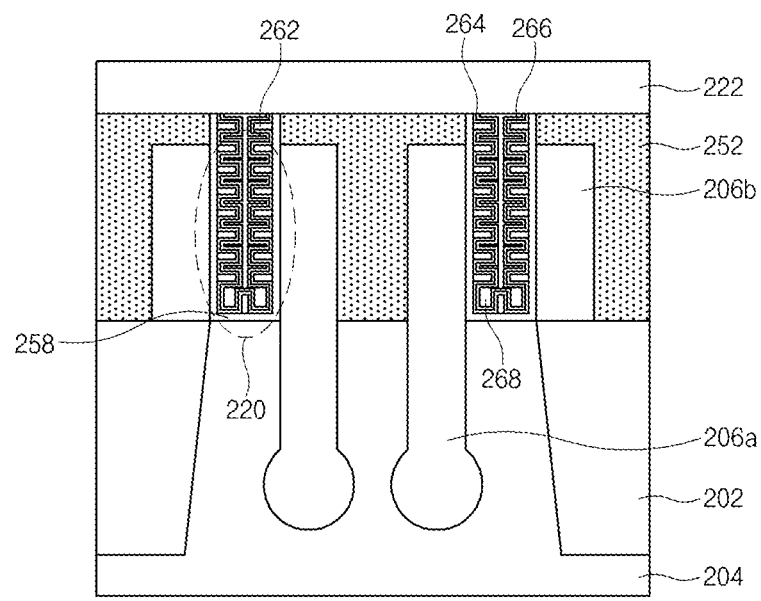

As illustrated in FIG. 3i, conductive material is deposited on the dielectric layer 264 to form an upper electrode. Here, the upper electrode is formed by performing a first deposition of conductive material on the dielectric layer 264 using one of an atomic layer deposition (ALD), a chemical vapor deposition (CVD), or a metal organic chemical vapor deposition (MOCVD) process to form a first electrode layer 266 and then by performing a second deposition of the conductive material to fill in gaps between the gate patterns to form a second electrode layer 268. The upper electrode comprises the first and second electrodes 266 and 268. The conductive material for use in the upper electrode of the present embodiment may include metal, silicate, silicide, polysilicon, poly-SiGe, amorphous silicon and/or amorphous-SiGe in single or in combination. Next, the plate layer 222 connected to the upper electrode of the capacitor is formed on the interlayer insulation layer 252 in a direction intersecting (e.g., perpendicular to) the word line (or the gate patterns 206a and 206b).

By using the method described above, the capacitor 220 includes the seed layer 258, a lower electrode comprising the plurality of the conductive pillars 262, the dielectric layer 264 and the upper electrode. Here, areas of the lower electrode and the upper electrode, which determine the capacitance of the capacitor 220, are greater than surface area surrounding the volume in which the plurality of the conductive pillars 262 are formed. Therefore, even though the capacitor 220 is formed within a relatively small area, the capacitor 220 can have a surprisingly large capacity that is similar in value to the capacity of a conventional pillar pattern capacitor having a high aspect ratio.

Figure 3J:
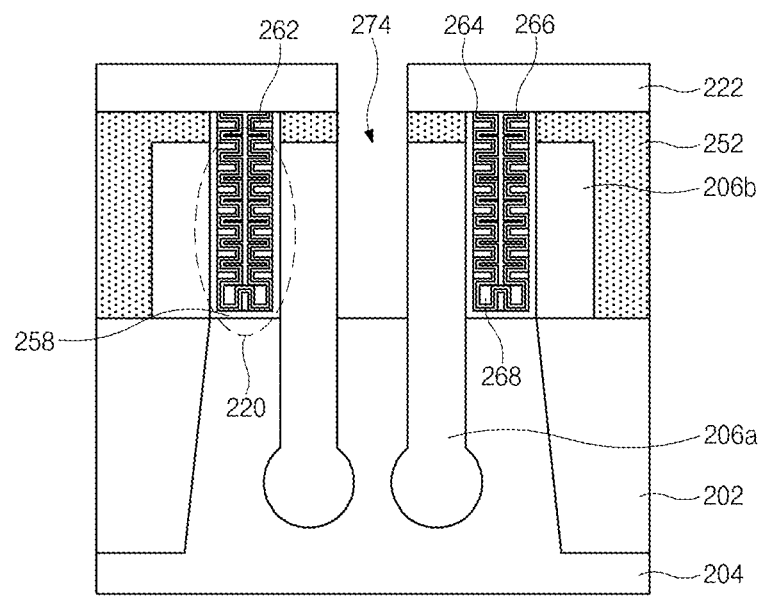

Various methods can be used to form the bit line 210. An exemplary embodiment is described below. Referring to FIG. 3j, in order to expose the other side of the source/drain region, a photoresist (not shown) is deposited on a gap between the gate patterns 206a and is patterned by an exposure process using a mask. Next, the exposed interlayer insulation layer 252 is removed to form the second contact hole 274, which exposes the other side of the source/drain region of a cell transistor, and the remaining photoresist is removed. Here, due to the second contact hole 274, a hole is formed on the plate layer 222 as shown in FIG. 2.

Figure 3K:
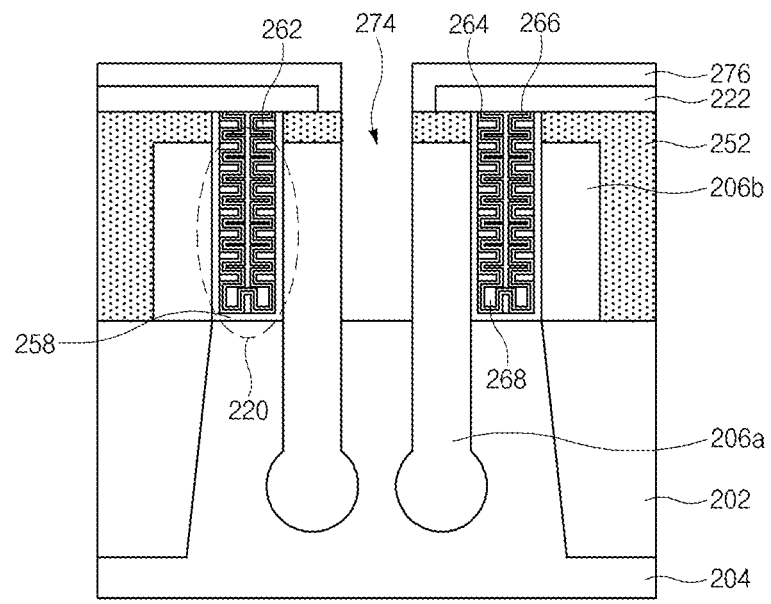
Figure 3L:
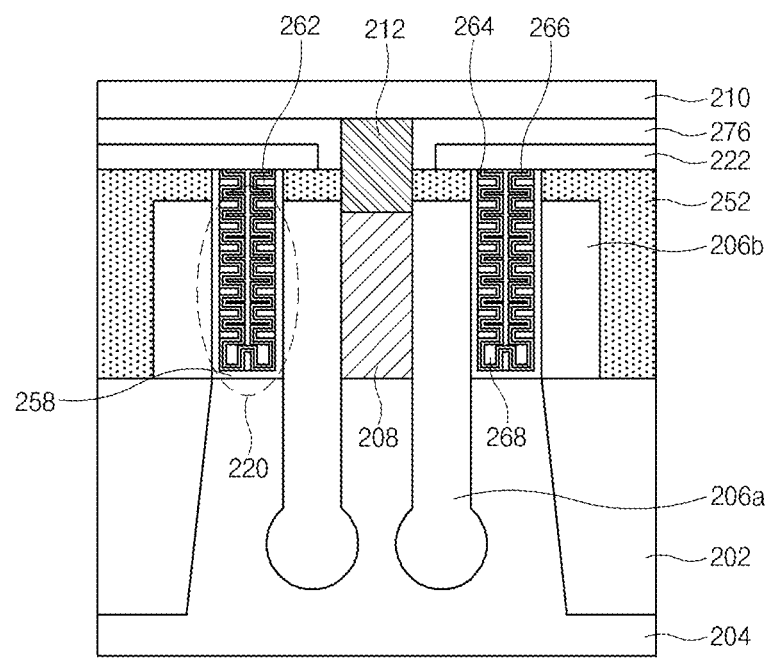

As illustrated in FIG. 3k, the insulation layer 276 is formed over the plate layer 222 by an oxidation or nitridation process. Here, the insulation layer 276 is not formed on the second contact hole 274 and thus the second contact hole 274 remains open. A surface exposed by a hole of the plate layer 222 that is formed when the second contact hole 274 is defined, is oxidized together with an upper portion of the plate layer 222, thereby forming an oxide layer having a predetermined thickness thereon.

Referring to FIG. 3j, conductive material is filled into the second contact hole 274 to form the landing plug contact 208 and the bit line contact 212, and the bit line 210 is formed in a direction intersecting (or perpendicular to) the word line. Next, a subsequent process is performed to form components of the semiconductor memory device such as a metal interconnection.

It is described that the nanotube growth process is utilized in some embodiments such as that described above. However, in alternative embodiments, nanowire growth is useful as an alternative to the nanotube growth. Where nanowire growth is used, the lower electrode of the capacitor positioned between the gate patterns may have a wire-shaped structure instead of a pillar-shaped structure (hereinafter, "conductive component" refers to either "conductive pillar" or "conductive wire").

FIGS. 4a through 4d are cross-sectional views illustrating a method of manufacturing a semiconductor memory device according to another embodiment of the present invention.

Figure 4A:
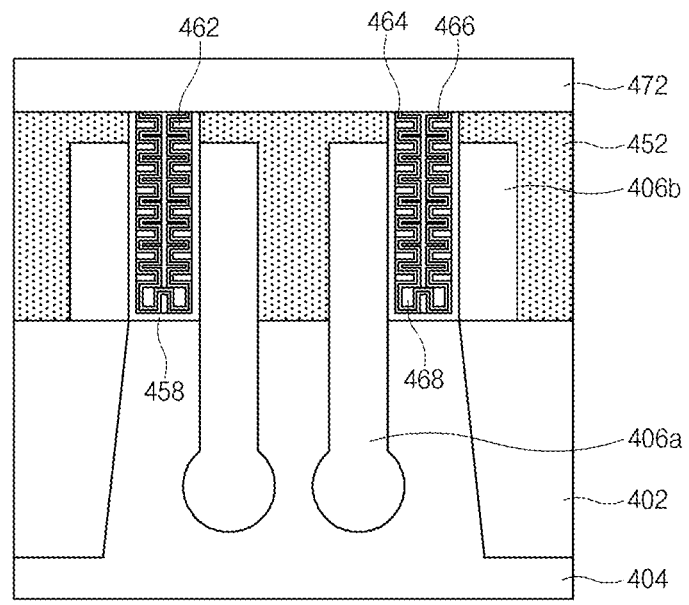
FIGS. 4a through 4d are cross-sectional views illustrating a method of manufacturing a semiconductor memory device according to another embodiment.

Referring to FIG. 4a, a sequence of processes carried out to form the upper electrode of the capacitor including a first electrode layer 466 and a second electrode layer 468 remain substantially same with the example embodiment illustrated in FIGS. 3a through 3i. Next, a first insulation layer 472 is deposited over the upper electrode of the capacitor and an interlayer insulation layer 452.

Figure 4B:
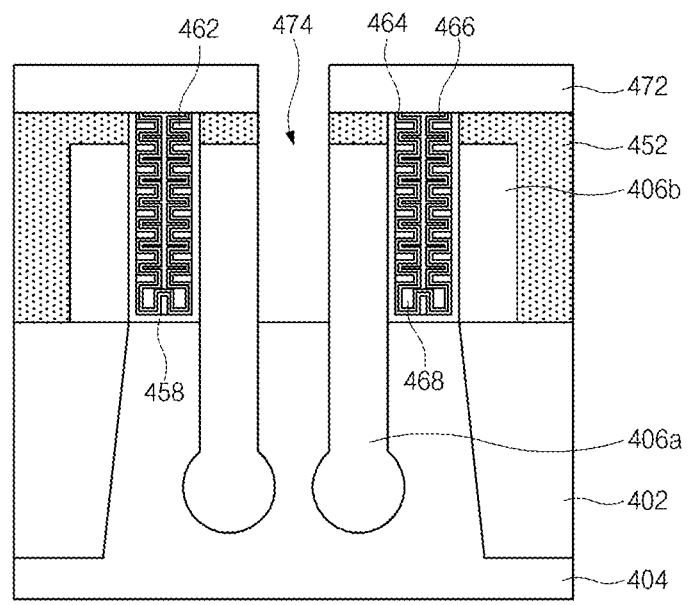

As illustrated in FIG. 4b, a second contact hole 474 for forming a bit line contact is formed between adjacent gate patterns. Specifically, a photoresist (not shown) is deposited on the first insulation layer 472 and is patterned by using an exposure process using a mask that defines a location of the second contact hole 474. Then, the first insulation layer 472 and the interlayer insulation layer 452 at a lower level are etched by using the patterned photoresist (not shown) to form the second contact hole 474. The remaining photoresist is removed thereafter.

Figure 4C:
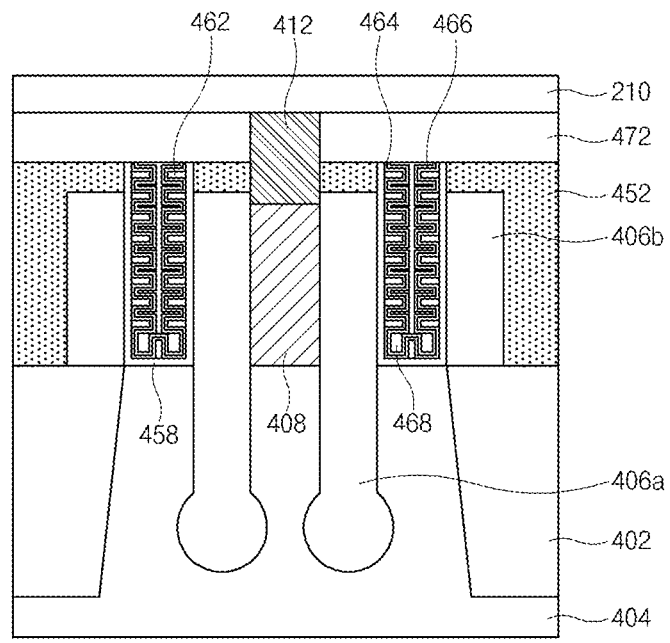

Referring to FIG. 4c, a conductive material is filled into the second contact hole 474 to form a landing plug contact 408 and a bit line contact 412, and a bit line 410 is formed on the first insulation layer 472 in a direction intersecting the gate pattern.

Figure 4D:
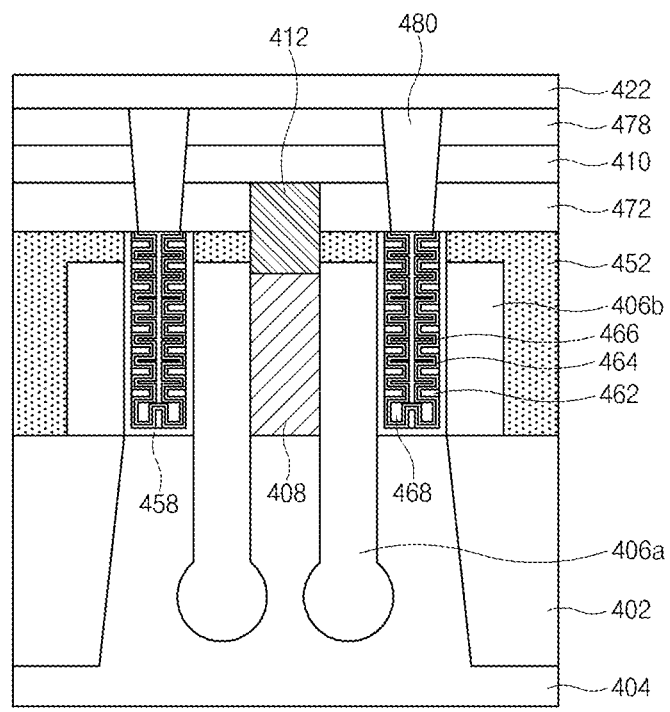

As shown in FIG. 4d, the second insulation layer 478 is deposited on the bit line 410 and a third contact hole (not shown) is formed to expose a lower electrode of the capacitor. A process of forming the third contact hole is similar to a process of forming the second contact hole 474, and the first insulation layer 472 and the second insulation layer 478 are etched to expose the lower electrode of the capacitor. Here, the bit line 410 is spaced apart by a predetermined distance from an area in which the third contact hole is formed so that the bit line 410 does not affect the formation of the third contact hole. Then, a conductive material is filled into the third contact hole to form a plate contact 480, and a plate line 422 is formed on the second insulation layer 478 and the plate contact 480. Here, the plate line 422 is not required to have a plane structure as the plate layer 222 described in FIG. 2, and can be formed in a common line structure since the plate line 422 is formed in a higher position than the bit line 410.

In further embodiments of the present invention, the plate line 422 can be formed such that the plate line 422 is positioned at a higher level than the bit line 410 by using the plate contact 480. The overall height of the semiconductor memory device is greatly reduced because the capacitor is positioned between adjacent gate patterns. When the plate line 422 is positioned to above the bit line 410, it becomes easier to connect the bit line 410 to other components; for example to a sense amplifier adjacent to a plurality of cells.

Figure 5:
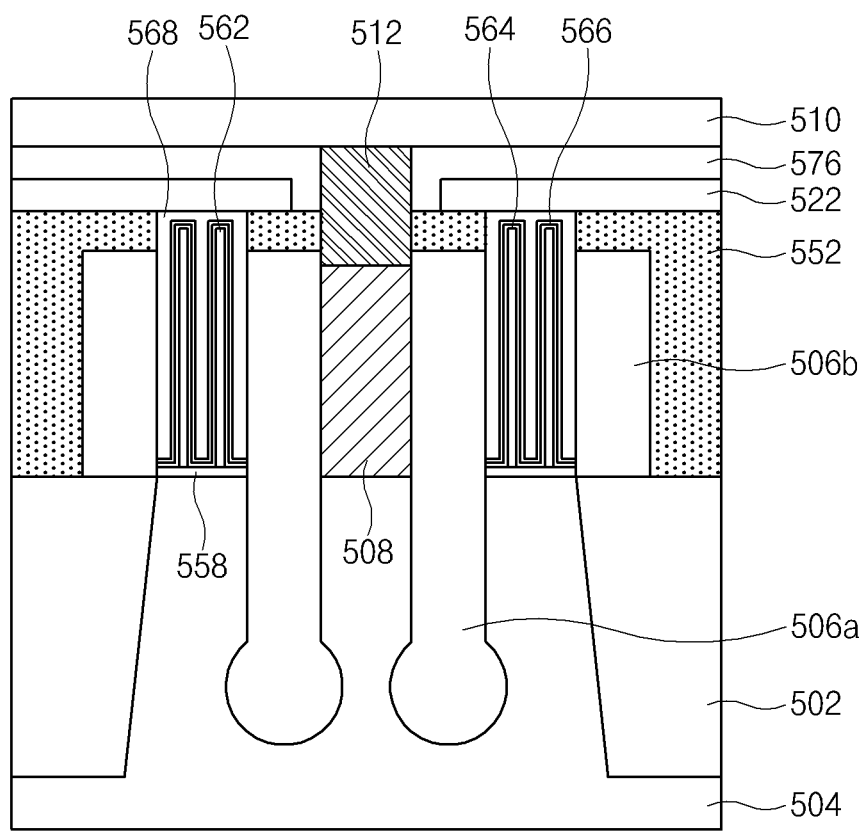
FIG. 5 is a cross-sectional view illustrating a semiconductor memory device according to another embodiment.

FIG. 5 is a cross-sectional view illustrating a semiconductor memory device in another embodiment.

In an embodiment described with respect to FIG. 2 through FIG. 4d, a nanotube or a nanowire included in the lower electrode of the capacitor is formed on a bottom surface and a side surface of the contact hole that is formed between gate patterns. This is because a nano growth is carried out after depositing the seed layer on the bottom surface and the side surface of the contact hole. By contrast, with reference to FIG. 5, in further embodiments the seed layer 558 is deposited only on the bottom surface of the contact hole (not shown) and not on the side surface thereof, and the nano growth process is performed such that the nanotube or the nanowire 562 having a height similar to a height of the gate pattern can grow from the bottom surface of the contact hole. Although, in these embodiments, the number of nanotubes or nanowires is decreased relative to embodiments having nanotubes or nanowires grown from both the side surface and the bottom surfaces of the contact hole, there is no disadvantage in terms of size of the lower electrode since the reduced number of nanotubes or the nanowires is compensated by the relative elongation of nanotubes or nanowires extending from the bottom surface. Excepting that the lower electrode of the capacitor is formed using a nano growth process, the method of the semiconductor memory device in this embodiment comprises substantially same steps disclosed with respect to embodiments illustrated with respect to in FIGS. 3a through 3J, or the further embodiments illustrated with respect to FIGS. 4a through 4d.

Figure 6:
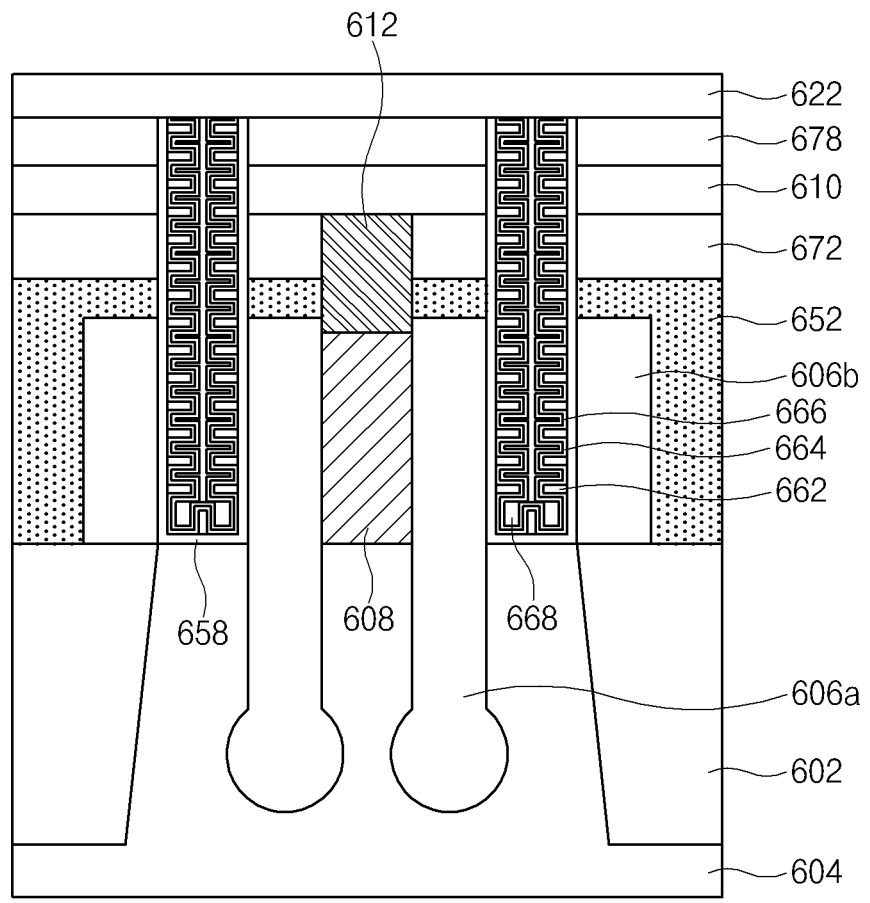
FIG. 6 is a cross-sectional view illustrating a semiconductor memory device according to still another embodiment.

FIG. 6 is a cross-sectional view illustrating another semiconductor memory device according to still further embodiments.

In various embodiments according FIG. 6, the semiconductor memory device has a plate line 622 formed in a position above the bit line 610, and a capacitor is formed in the source/drain region to reach the plate line 622 using the nano growth process. In contrast to the embodiments disclosed above, after the gate patterns 606a and 606b are formed, the bit line contact 612 and the bit line 610 are formed prior to the formation of the capacitor. After the bit line 610 is formed, a contact hole (not shown) in which the capacitor is to be positioned is formed, and the seed layer 658 is deposited to form a conductive pillar or wire by using the nano growth process. In an embodiment with respect to FIG. 6, as the size of the lower electrode of the capacitor is increased, the capacitance of the capacitor can be greatly increased, while reducing the semiconductor memory device height relative to conventional semiconductor memory devices.

As explained with respect to the embodiments above, a method of manufacturing a semiconductor memory device is disclosed in which a capacitor is formed in one side of the source/drain region positioned between gate patterns of adjacent cell transistors, the plate line connected to an upper portion of the capacitor is formed in a direction intersecting the gate pattern, and the bit line connected to the other side of the source/drain region is formed in a position above the plate line. Thus, in the method according to the present invention, the capacitor of a highly integrated semiconductor memory device is formed between adjacent gate patterns, thereby eliminating the need for an additional element such as a landing plug contact or a storage node contact. Particularly, by connecting the capacitor and the source/drain region without passing through the storage node contact, the resistance of the storage node can be reduced. Also, since the semiconductor memory device can have a height that is decreased up to about 50%, the number of manufacturing processes can be decreased, thereby reducing time and cost of manufacturing. In addition, a manufacturing defect caused due to, for example, an arrangement error occurring during a manufacturing process is greatly reduced, thereby decreasing a defect ratio of products.

Further, the capacitor is positioned between the gate patterns so that the need to form the storage node contact is obviated in case where a unit cell has an area of $8F^2$ as well as $6\ F^2$ (herein, 'F' is a minimum width under design rule). Therefore, since a layout margin among respective components is not sharply reduced, the present methods are easy to apply.

It will be apparent to those skilled in the art that numerous modifications and variations can be made without departing from the spirit or scope of the invention. It will be understood that the scope of the present invention comprises the numerous modifications and variations of this invention, and that the invention is defined by the scope of the appended claims and equivalents.

What is claimed is:

1. A semiconductor memory device, comprising: a first gate pattern formed on an active region;
   a second gate pattern provided adjacent to a first side of the first gate pattern, wherein the second gate pattern is formed on a field isolation layer defining the active region;
   a third gate pattern provided adjacent to a second side of the first gate pattern, the second side opposing the first side, wherein the third gate pattern is formed on the active region;
   a capacitor directly coupled to the active region between the first and second gate patterns;
   a plate layer coupled to an upper portion of the capacitor, the plate layer extending in a first direction; and
   a bit line coupled to the active region between the first and the third gate patterns, the bit line extending in the first direction,
   wherein the capacitor comprises:

a lower electrode including a seed layer and a plurality of conductive components extending from the seed layer;

a dielectric layer formed over the seed layer and the conductive components; and an upper electrode formed over the dielectric layer, wherein the lower electrode, the dielectric layer, and the upper electrode are provided in a trench defined by the first and the second gate patterns, and wherein the seed layer is directly formed on a whole surface of a sidewall as well as a bottom surface of the trench defined by the first and the second gate patterns, and wherein the plurality of conductive components are directly formed on a bottom and a sidewall surface of the seed layer.

2. The semiconductor memory device of claim 1, the plurality of conductive components are conductive pillars.

3. The semiconductor memory device of claim 2, wherein each of the conductive pillars has a length of no more than 1000 nm.

4. The semiconductor memory device of claim 2, wherein the seed layer comprises transition metal material, nickel, iron, cobalt, platinum, palladium, or an alloy combination thereof.

5. The semiconductor memory device of claim 1, wherein each of the plurality of conductive components has a length substantially the same as a length of the second gate pattern.

6. The semiconductor memory device of claim 1, wherein the bit line is provided over the plate layer, and the plate layer is coupled to the upper electrode of the capacitor, and wherein the plate layer has a planar structure.

7. The semiconductor memory device of claim 1, wherein the plate layer is provided over the bit line, and the plate layer is coupled to the upper electrode of the capacitor through a plate contact, and wherein the plate layer has a line structure.

8. The semiconductor memory device of claim 1, wherein the plate layer is provided over the bit line, and the capacitor is extending from the active region to the plate layer.

9. The semiconductor memory device of claim 1, the device further comprising a landing plug contact and a bit line contact that are positioned between (i) the active region between the first and the third gate patterns and (ii) the bit line.

* * * * *